(12) United States Patent
Inokuma et al.

(10) Patent No.: US 7,164,113 B2
(45) Date of Patent: *Jan. 16, 2007

(54) SOLID STATE IMAGING DEVICE WITH SEMICONDUCTOR IMAGING AND PROCESSING CHIPS

(75) Inventors: Kazuyuki Inokuma, Yawata (JP); Toshiya Fujii, Otsu (JP); Takumi Yamaguchi, Kyoto (JP); Shigetaka Kasuga, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 254 days.

This patent is subject to a terminal disclaimer.

(21) Appl. No.: 10/676,136

(22) Filed: Sep. 30, 2003

(65) Prior Publication Data

US 2004/0095495 A1    May 20, 2004

(30) Foreign Application Priority Data

Sep. 30, 2002 (JP) ............................. 2002-287609

(51) Int. Cl.
*H01L 27/00* (2006.01)

(52) U.S. Cl. .................................. 250/208.1; 257/686

(58) Field of Classification Search ............. 250/208.1, 250/239; 257/686; 348/222.1
See application file for complete search history.

(56) References Cited

U.S. PATENT DOCUMENTS

| 4,631,400 | A  | * | 12/1986 | Tanner et al. ................ 250/221 |
| 5,345,266 | A  | * | 9/1994 | Denyer ........................ 348/300 |
| 5,952,714 | A  |   | 9/1999 | Sano et al. .................. 257/680 |
| 6,366,321 | B1 | * | 4/2002 | Yonemoto .................... 348/308 |
| 6,521,881 | B1 | * | 2/2003 | Tu et al. .................... 250/208.1 |
| 6,844,619 | B1 | * | 1/2005 | Tago ......................... 257/686 |

FOREIGN PATENT DOCUMENTS

| JP | 5-268535 | 10/1993 |
| WO | 99/55082 | 10/1999 |

* cited by examiner

*Primary Examiner*—Thanh X. Luu
(74) *Attorney, Agent, or Firm*—Hamre, Schumann, Mueller & Larson, P.C.

(57) ABSTRACT

The present invention provides a small, high-performance imaging device and its application to products at low cost by preventing noise superimposed on a timing pulse feed line from affecting the output of an imaging chip. The imaging device includes two chips: an imaging chip 101 including a sensor 102 and an image processing chip 106 including an image processing circuit 110. The transistors of all circuits in the imaging chip 101 are formed as either nMOS or pMOS transistors. The imaging chip 101 is stacked on the image processing chip 106.

14 Claims, 7 Drawing Sheets

Wire bonding method

Si through electrode method

SOLID STATE IMAGING DEVICE WITH SEMICONDUCTOR IMAGING AND PROCESSING CHIPS

BACKGROUND OF THE INVENTION

1. Field of the Invention

The present invention relates to a small imaging device used, e.g., in cellular phones. Specifically, the present invention relates to a solid state imaging device that can achieve high levels of microminiaturization, low cost, and high performance, and small equipment using the solid state imaging device.

2. Description of the Related Art

In recent years, a small imaging device that can be built even in small equipment such as a cellular phone has been under development. There are some requirements for this type of imaging device: first, the size is very small; second, the cost is low. A CMOS sensor that can reduce the cost by facilitating connectivity to peripheral circuits using a general CMOS process with logic LSI has been in the mainstream. The CMOS sensor can form a one-chip structure with a logic portion. Therefore, it also can achieve microminiaturization by forming a one-chip structure with an image processing portion. FIG. 6 shows the configuration of a conventional one-chip CMOS sensor. The one-chip CMOS sensor in FIG. 6 includes the following: a sensor 507 for converting light into an electric signal; a vertical scanning circuit 506 for driving the sensor; a horizontal scanning circuit 508; a timing generator (TG) 503; a gain control amplifier (GCA) 504 for amplifying a signal output from the sensor; an analog/digital converter (ADC) 505 for converting the output signal into a digital signal; and an image processing circuit 502.

However, there is a growing demand for not only microminiaturization and low cost, but also high performance such as sensitivity. It is difficult to contain a lighting unit, e.g., a strobe in small equipment like a cellular phone. Therefore, higher sensitivity is required particularly for the small equipment. Moreover, it is expected that cellular phones will be used instead of digital still cameras, which makes high performance increasingly important as a development theme.

In view of high performance, the following problems arise in the conventional configuration. When the logic circuit and the analog circuit (the sensor) are formed in one chip, they should be fabricated in the same process despite a difference in required electrical performance. Therefore, it is difficult to satisfy the performance of both the logic circuit and the sensor. When fine processing is employed, the sensor performance becomes poor. When processing that is not fine is employed to ensure the sensor performance, the logic portion is too large to enjoy the benefits of one chip. To avoid this, a method for using a two-chip structure has been proposed. The two-chip structure is composed of an imaging chip including the sensor and an image processing chip including the imaging processing portion.

Examples of the conventional technique related to the present invention include a method in which an imaging chip is stacked on an image processing chip, thereby reducing the mounting area and the size (JP 5(1993)-268535 A).

FIG. 7 shows a conventional imaging device with a two-chip structure of an imaging chip and an image processing chip. The imaging device in FIG. 7 allows the imaging chip 601 to operate independently regardless of the type of an image processing chip 608 by mounting the following components on the imaging chip 601: a sensor 603; vertical and horizontal scanning circuits 604, 605 for driving the sensor 603; a timing generator 602 for generating a pulse needed for the scanning circuits; a gain control amplifier 606 for amplifying a signal output from the sensor 603; and an analog/digital converter 607 for converting the output signal into a digital signal.

For this configuration, the circuits that inherently can exhibit their performance by CMOS logic, such as the timing generator 602, are still present in the imaging chip. Therefore, an improvement in performance of the sensor 603 causes an increase in area of those circuits.

This problem can be solved by mounting the timing generator 602, the gain control amplifier 606, and the analog/digital converter 607 on the image processing chip 608. However, timing pulse feed lines from the image processing chip 608 to the imaging chip 601 are increased, noise is superimposed on the feed lines, and this noise is superimposed on the output of the imaging chip 601, thus degrading the performance of the imaging chip.

It has been clear that this noise is caused by a fluctuation in current supplied to the scanning circuit that mainly drives the pixel portion. When the scanning circuit is formed using CMOS logic, the current fluctuation is due to a so-called through current generated by switching of a CMOS circuit. Although the CMOS circuit generally is characterized by low current consumption, it is well known that a very large current (through current) flows at the moment of switching. This is because both nMOS and pMOS transistors are in the on state only at the moment of switching to create a short circuit in the power supply and the ground. When wiring that controls the switching is located outside the chip, noise is superimposed on the wiring itself or a pulse transmitted through the wiring is rounded, so that noise of the power supply due to the through current is increased.

SUMMARY OF THE INVENTION

Therefore, with the foregoing in mind, it is an object of the present invention to provide a small, high-performance imaging device and its application to products at low cost by preventing noise superimposed on a timing pulse feed line from affecting the output of an imaging chip.

A solid state imaging device of the present invention includes an imaging semiconductor chip in which all transistors are formed of the same electric conductor and an image processing semiconductor chip including CMOS transistors.

In the solid state imaging device, all transistors of the imaging semiconductor chip are formed of the same electric conductor, thereby eliminating a through current peculiar to a CMOS circuit. Accordingly, even if the timing pulse feed line is located outside the chip, noise superimposed on a power supply is not increased. This allows the timing generator or the like to be provided not in the imaging semiconductor chip, but in the image processing semiconductor chip to which a finer fabrication process can be applied. Thus, a small, high-performance imaging device can be produced at low cost.

BRIEF DESCRIPTION OF THE DRAWINGS

FIG. 3A illustrates a wire bonding method, and FIG. 3B illustrates a method using a Si through electrode.

DESCRIPTION OF THE PREFERRED EMBODIMENTS

Figure 1:
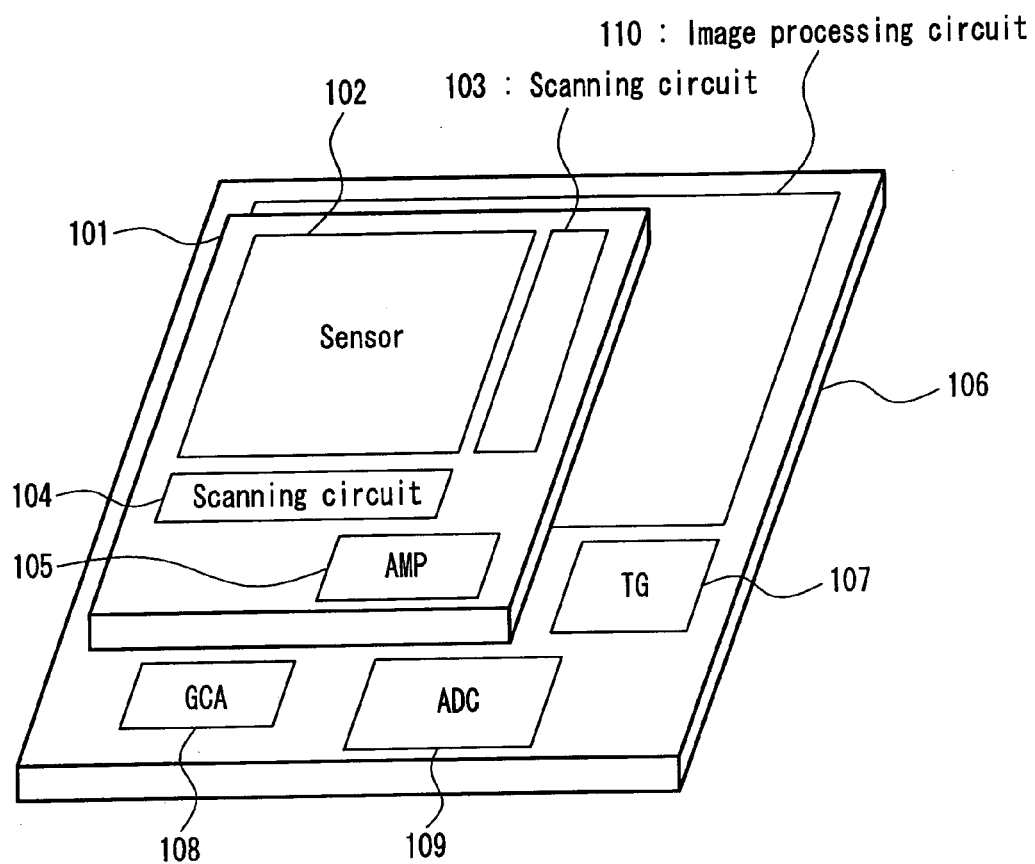
FIG. 1 is a perspective view showing the configuration of an embodiment of an imaging device of the present invention.

In a solid state imaging device of the present invention, all transistors of the imaging semiconductor chip are formed of the same electric conductor. The solid state imaging device preferably has a configuration in which the imaging semiconductor chip is stacked on the image processing semiconductor chip. This configuration can shorten the length of wiring that connects the imaging semiconductor chip and the image processing semiconductor chip, reduce the superimposition of noise on the timing pulse feed line, and achieve higher performance. By stacking these chips, the length of wiring can be shortened, and thus noise superimposed on an image signal that is output from the imaging semiconductor chip also can be reduced. When all transistors of the imaging semiconductor chip are formed of the same electric conductor, it is difficult to provide an amplifier with a large amplification factor. Therefore, the effect of stacking the chips in the solid state imaging device is more significant than the effect of stacking a conventional CMOS imaging semiconductor chip on an image processing semiconductor chip. Moreover, the mounting area is equal to or less than the mounting area of a one-chip structure, so that microminiaturization can be achieved as well. This results in a very small, low cost, and high-performance imaging device, and when applied to various products having imaging functions, the imaging device can contribute to microminiaturization, low cost, and high performance of the products.

In the solid state imaging device, it is preferable that all transistors of the imaging semiconductor chip are formed as n-channel MOS transistors or p-channel MOS transistors. Particularly when all transistors are formed as n-channel MOS transistors, the speed is enhanced easily.

In the solid state imaging device, the imaging semiconductor chip and the image processing semiconductor chip may be connected electrically in any of the following manners: the electrical connection is made by a bonding wire; and a through electrode is provided in the imaging semiconductor chip, and the electrical connection is made via wiring connected to the through electrode. The former is superior in cost and reliability because a general technique such as wire bonding can be employed. The latter has the advantage of further reducing the size. It is more preferable that the through electrode is a Si through electrode.

In the solid state imaging device, it is preferable that the image processing semiconductor chip includes a timing generator for supplying a timing pulse to the imaging semiconductor chip, a gain control amplifier, and an analog/digital converter. This configuration allows for further miniaturization.

In the solid state imaging device, it is preferable that a timing pulse output terminal of the image processing semiconductor chip is located close to a timing pulse input terminal of the imaging semiconductor chip. This configuration can make the length of the timing pulse feed line as short as possible, thereby further reducing noise and contributing to high performance of the imaging device.

In the solid state imaging device, it is preferable that an image signal input terminal of the image processing semiconductor chip is located close to an image signal output terminal of the imaging semiconductor chip. This configuration can make the length of the image signal line as short as possible, thereby reducing noise superimposed on an image signal and contributing to high performance of the imaging device. As described above, when all transistors of the imaging semiconductor chip are formed of the same electric conductor, it is difficult to provide an amplifier with a large amplification factor. Consequently, an image signal output from the imaging semiconductor chip has a very low level and is likely to be affected by noise. Therefore, the effect of reducing the length of the image signal line is particularly significant in the solid state imaging device.

When the solid state imaging device of the present invention is applied to equipment that includes an image processing portion for processing a static image or a dynamic image produced by this solid state imaging device, a small, high-performance cellular phone, information terminal, or digital still camera can be provided at low cost.

Hereinafter, an embodiment of the present invention will be described more specifically with reference to the drawings.

Figure 2:
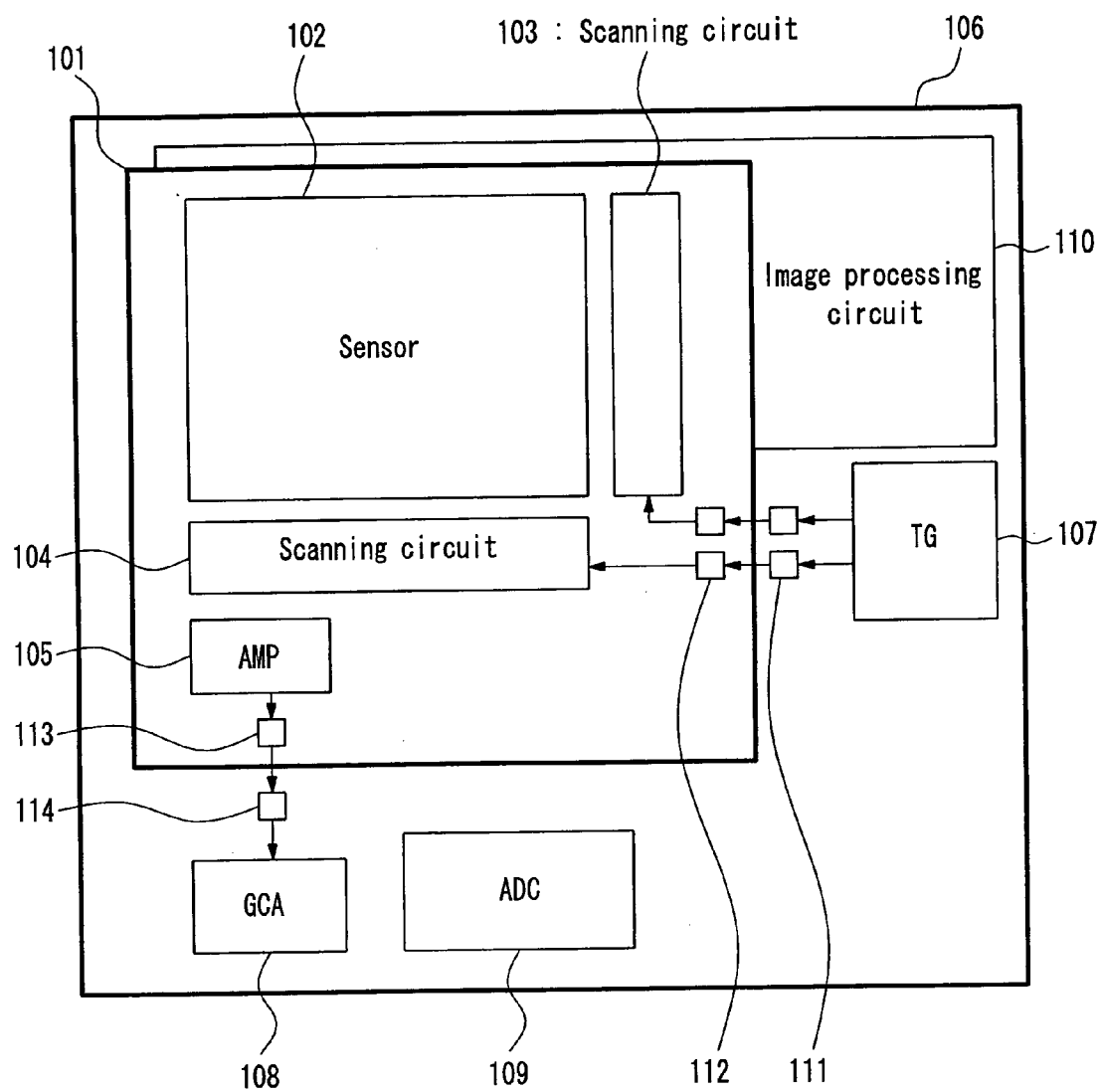
FIG. 2 is a plan view of the imaging device in FIG. 1.

FIGS. 1 and 2 show an embodiment of an imaging device of the present invention. FIG. 1 is a perspective view showing the schematic configuration of an imaging device of this embodiment. FIG. 2 is a plan view showing the configuration of the imaging device. The imaging device includes two chips: an imaging chip (imaging semiconductor chip) 101 and an image processing chip (image processing semiconductor chip) 106. The imaging chip 101 is stacked on the image processing chip 106. The imaging chip 101 includes a sensor 102 for converting light into an electric signal, vertical and horizontal scanning circuits 103, 104 for driving the sensor 102, and an amplifier 105 for amplifying the signal of the sensor 102. As shown in FIG. 2, the imaging chip 101 also includes a plurality of terminals including a timing pulse input terminal 112 and an image signal output terminal 113. The timing pulse input terminal 112 receives a timing pulse from a timing generator (TG) 107. The image signal output terminal 113 outputs an image signal. FIG. 2 shows only some of the terminals and omits the other terminals. FIG. 1 omits the terminals.

All transistors used in these circuits of the imaging chip 101 are formed of the same electric conductor, i.e., an nMOS or pMOS. The scanning circuits 103, 104 are dynamic circuits. This configuration can prevent the generation of a through current peculiar to a CMOS circuit. Therefore, even if the timing generator 107 is located outside the imaging chip 101, noise superimposed on the timing pulse feed line has a smaller effect on the output of the imaging chip 101.

The image processing chip 106 includes the timing generator 107, a gain control amplifier (GCA) 108, an analog/digital converter (ADC) 109, and an image processing circuit 110. The timing generator 107 generates a signal for driving the imaging chip 101. The gain control amplifier 108 controls the magnitude of a signal from the imaging chip 101. The analog/digital converter 109 converts the signal into a digital signal. The image processing circuit 110 generates a luminance signal and a color signal from the signal of the imaging chip 101 that has been converted into a digital signal. Transistors used in these circuits are a CMOS type, which is used in a conventional logic circuit and obtained by the combination of an nMOS and pMOS. As shown in FIG. 2, the image processing chip 106 also includes a plurality of terminals including a timing pulse output terminal 111 and an image signal input terminal 114. The timing pulse output terminal 111 outputs a timing pulse. The image signal input terminal 114 receives an image signal from the imaging chip 101.

The timing pulse output terminal 111 is located in the vicinity of the timing pulse input terminal 112, and specifically at the position closest to the timing pulse input terminal 112 compared with any other terminals in the image processing chip 106. In other words, the timing generator 107 is located in the vicinity of the timing pulse input terminal 112. A timing pulse from the timing pulse input terminal 112 is transmitted to the scanning circuits 103, 104 and used to drive the sensor 102.

The image signal input terminal 114 is located in the vicinity of the image signal output terminal 113, and specifically at the position closest to the image signal output terminal 113 compared with any other terminals in the image processing chip 106. In other words, the gain control amplifier 108 is located in the vicinity of the image signal output terminal 113. An image signal from the imaging chip 101 is input to the image processing chip 106 via the image signal input terminal 114, transmitted through the gain control amplifier 108 and the analog/digital converter 109, where the image signal is converted into a digital signal, and then is image-processed by the image processing circuit 110. In the image processing chip 106, it is preferable that the gain control amplifier 108 is located as close as possible to the image signal input terminal 114, thereby reducing noise superimposed on the image signal not only outside but also inside the chip.

Figure 3A:
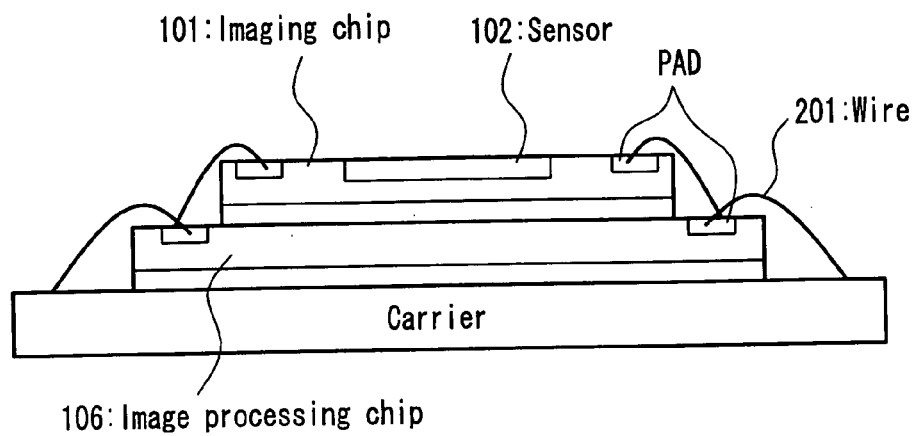
FIGS. 3A and 3B are cross-sectional views, each showing a method for stacking chips in an imaging device of the present invention.
Figure 3B:
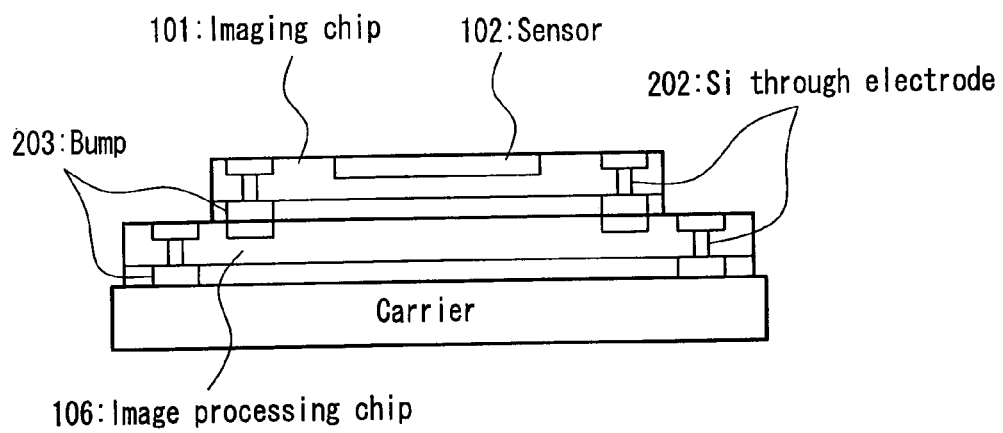

FIGS. 3A and 3B show two examples of methods for stacking the imaging chip 101 and the image processing chip 106.

In FIG. 3A, the imaging chip 101 and the image processing chip 106 are connected by wire bonding. A wire 201 connects a pad of the imaging chip 101 and a pad of the image processing chip 106. The wire bonding itself is used generally in mass production and thus is advantageous in cost and reliability.

In this case, a pad is provided in the portion where the imaging chip 101 is not stacked, and the gain control amplifier 108 is located in the vicinity of the pad.

In FIG. 3B, a Si through electrode 202 is provided in the imaging chip 101 so that the electrode is drawn to the bottom, at which a bump 203 is formed to make connection with the image processing chip 106. The Si through electrode 202 is advantageous in achieving the greatest reduction in size and is expected to be mainstream in the future.

In this case, the image signal input terminal 114 and the gain control amplifier 108 of the image processing chip 106 are located directly under the image signal output terminal 113 of the imaging chip 101.

The above configuration can have the following effects.

First, all circuits of the imaging chip 101 are formed as an nMOS or pMOS, so that a through current peculiar to a CMOS circuit is eliminated. Therefore, even if the timing pulse feed line is located outside the imaging chip 101, noise superimposed on a power supply is not increased. This allows the timing generator 107 or the analog/digital converter 109 to be provided not in the imaging chip 101, but in the image processing chip 106 to which a finer fabrication process can be applied. Thus, the chip area is reduced as a whole, contributing to lower cost. Second, all circuits of the imaging chip 101 are formed as an nMOS or pMOS, so that the fabrication process is simplified. Thus, the number of masks to be used in the fabrication process is reduced, contributing to even lower cost. Third, all circuits of the imaging chip 101 are formed as an nMOS or pMOS, so that the number of steps in the fabrication process is reduced. Thus, factors that can degrade the electrical characteristics of an analog portion are reduced, contributing to higher performance.

Fourth, the imaging chip 101 is stacked on the image processing chip 106, so that the length of wiring that connects them can be shortened. Thus, the superimposition of noise on the timing pulse feed line is reduced, contributing to even higher performance. Fifth, the image signal output terminal 113 of the imaging chip 101 and the image signal input terminal 114 of the image processing chip 106 are located close to each other, and the gain control amplifier 108 is located in the vicinity of the image signal input terminal 114, so that noise superimposed on an image signal also can be reduced. When it is difficult to provide an amplifier with a large amplification factor like the present invention in which all transistors are formed of the same electric conductor, this configuration can offer a particularly large effect. Sixth, the imaging chip 101 is formed on the image processing chip 106, so that the mounting area is equal to or less than the mounting area of a one-chip structure, and thus microminiaturization can be achieved.

As described above, the present invention can provide a very small, low cost, and high-performance imaging device. Accordingly, the application of this imaging device can produce many valuable products. For example, a cellular phone including the imaging device can achieve high performance, particularly high sensitivity, in addition to a small size that is one of the most desired features of the cellular phone. Therefore, the cellular phone can shoot even under low light conditions without using a lighting unit such as a strobe. It is very difficult to contain the lighting unit such as a strobe in cellular phones because the lighting unit increases electrical power consumption.

Figure 4:
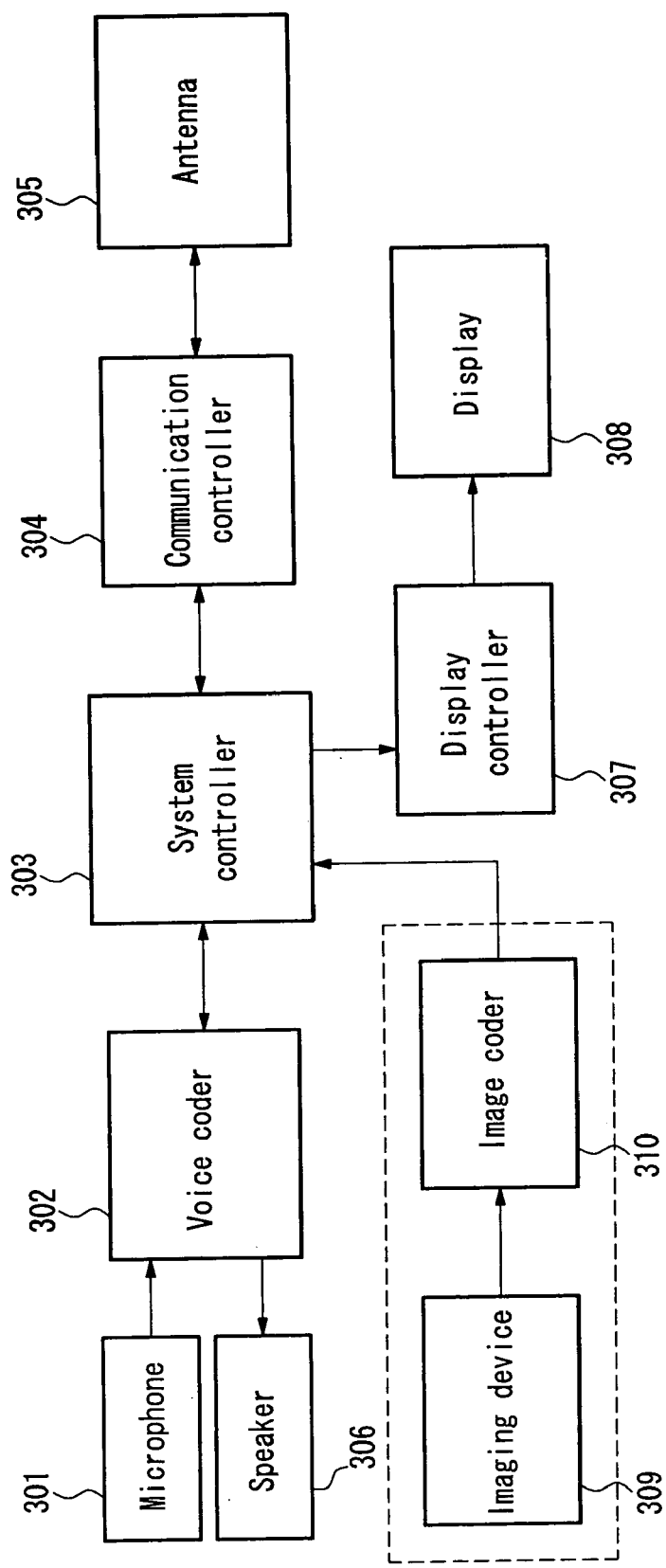
FIG. 4 is a block diagram showing the configuration of a cellular phone that includes an imaging device of the present invention.

FIG. 4 shows an example of the configuration when an imaging device of the present invention is applied to a cellular phone. The cellular phone in FIG. 4 includes the following: a microphone 301; a voice coder 302; a system controller 303; a communication controller 304; an antenna 305; a speaker 306; a display controller 307; and a display 308. These are general components of a conventional cellular phone.

This cellular phone further includes an imaging device 309 of the present invention and an image coder 310 for encoding a picture signal that is output from the imaging device 309. The imaging device 309 has a two-chip structure of an imaging chip and an image processing chip, as shown in FIGS. 1 and 2.

In the cellular phone of FIG. 4, speech input from the microphone 301 is encoded and compressed by the voice coder 302. The compressed voice data is transmitted to the communication controller 304 by the system controller 303, modulated for communications, and sent from the antenna 305. For receiving, the voice data is transmitted in the reverse order, and speech is output from the speaker 306. The system controller 303 timely controls the display controller 307 so as to display necessary information on the display 308. In this manner, a camera phone can be produced only by adding the imaging device 309 of the present invention and the image coder 310 to a conventional cellular phone.

For static images, the system controller 303 can perform both decoding and encoding of the images. Therefore, the image coder 310 may be removed in some cases. For dynamic images, however, it is preferable to use the image coder 310 because the amount of processing to encode the dynamic images is large. Although the system controller 303 can perform decoding as described above, it is preferable to use a decoder specifically designed for the dynamic images.

The imaging device of the present invention can be incorporated not in only a cellular phone, but also an information terminal (e.g., so-called PDA), which is similar in structure to the cellular phone, with the same configuration. Such a small information terminal including the imaging device of the present invention can contain a high-performance camera and also can be used as a digital still camera.

Figure 5:
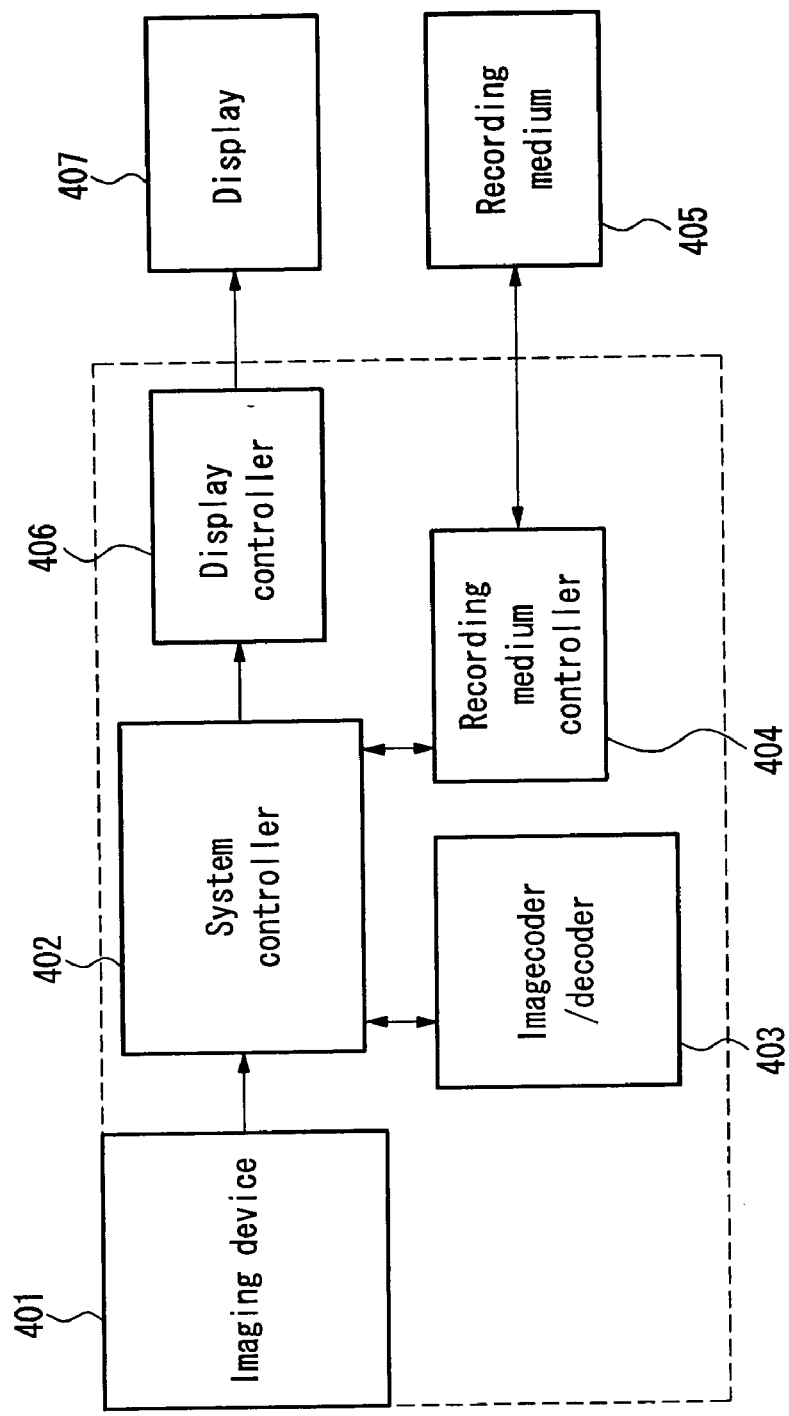
FIG. 5 is a block diagram showing the configuration of a digital still camera that includes an imaging device of the present invention.
Figure 6:
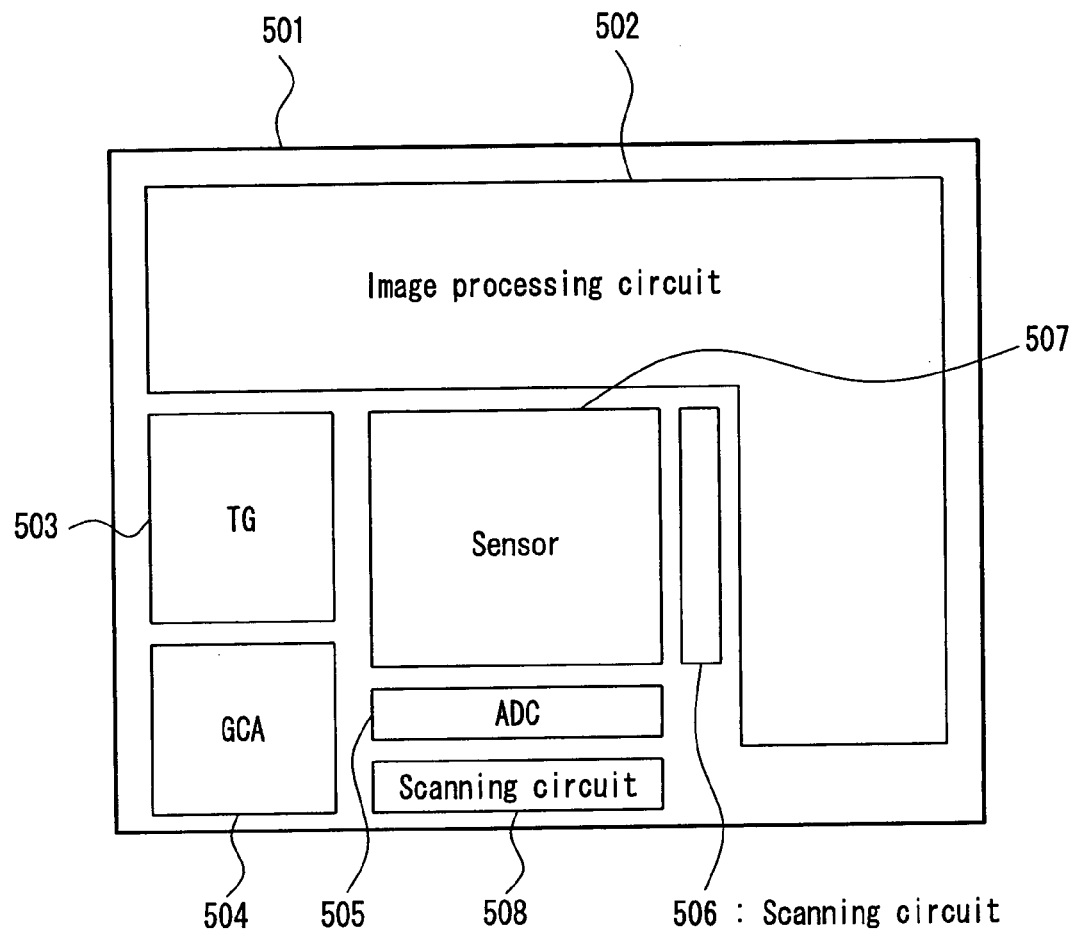
FIG. 6 is a block diagram showing the configuration of a conventional one-chip CMOS camera.
Figure 7:
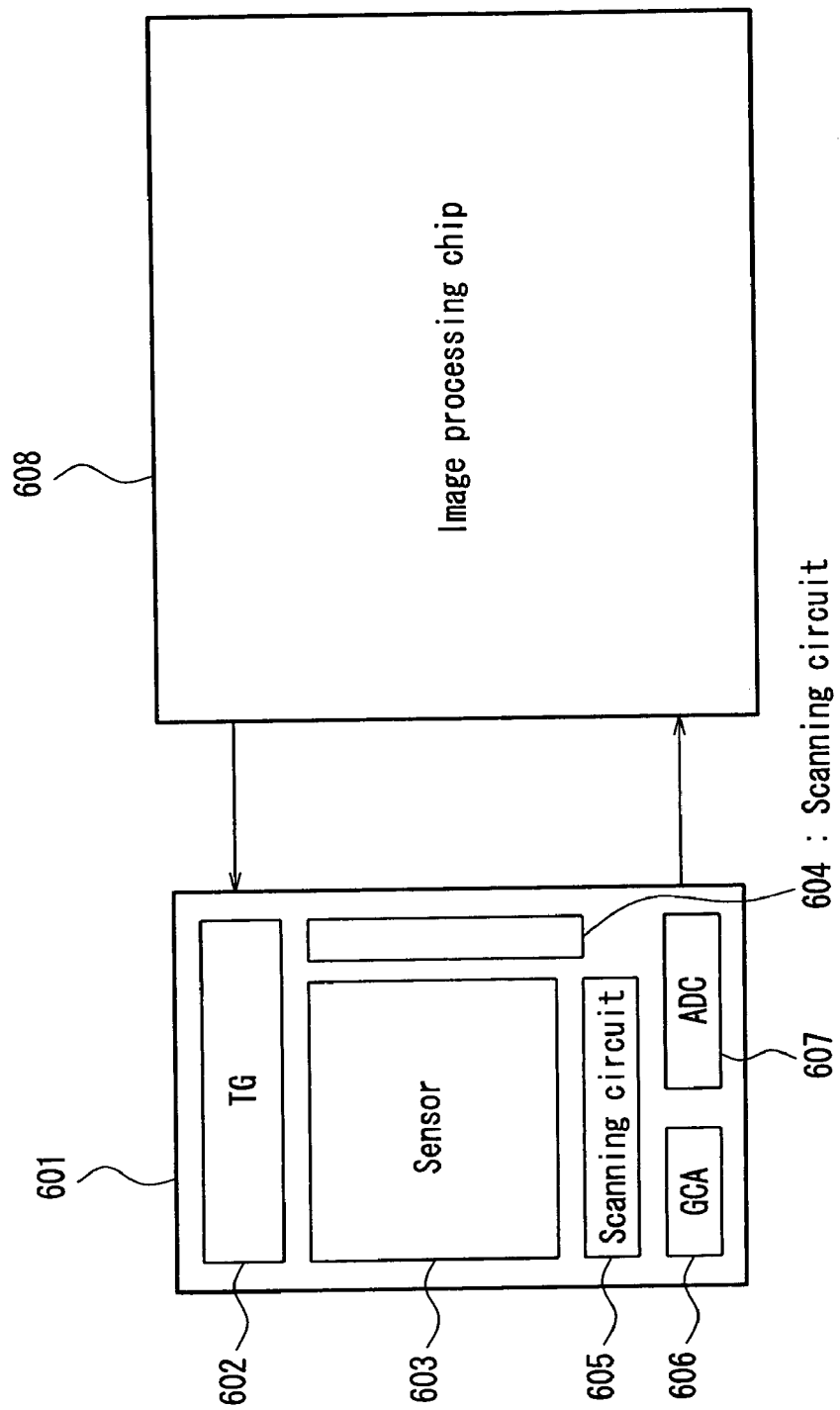
FIG. 7 is a block diagram showing the configuration of a conventional two-chip CMOS camera.

FIG. 5 shows an example of the configuration when an imaging device of the present invention is applied to a digital still camera. The digital still camera in FIG. 5 includes the following: an imaging device 401 of the present invention; a system controller 402 for overall control; an image coder/decoder 403 for compressing/expanding images; a recording medium controller 404 for recording compressed image data on a recording medium 405; a display controller 406 for displaying images; and a display 407.

The imaging device 401 has a two-chip structure of an imaging chip and an image processing chip, as shown in FIGS. 1 and 2. As indicated by the dotted line in FIG. 5, the system controller 402, the image coder/decoder 403, the recording medium controller 404, and the display controller 406 may be mounted on the image processing chip of the imaging device 401.

A digital still camera requires a high-pixel imaging chip, so that the size of the imaging chip necessarily is larger than that used for a cellular phone or the like. This inevitably increases the size of the image processing chip, and therefore it is preferable that circuits other than the image processing portion should be integrated.

The most significant effect of applying the imaging device of the present invention to a digital still camera is miniaturization. As described in the following, the imaging device of the present invention also can contribute to higher performance of a digital camera.

A conventional digital still camera, which uses a CCD-type imaging chip as an imaging chip, has the following problems. A sensor of the CCD-type imaging chip includes a photoelectric conversion element for converting light into an electric charge and a CCD element for carrying the electrical charge. The CCD element cannot be much smaller than the photoelectric conversion element because it carries the electric charge generated by the photoelectric conversion element. In other words, it is not possible to increase a proportion of the area occupied by the photoelectric conversion element in the conventional digital still camera.

In contrast, the digital still camera of this embodiment uses an imaging chip that has a sensor including a photoelectric conversion element and a transistor. The transistor can be made smaller than the photoelectric conversion element. Therefore, it is possible to increase a proportion of the area occupied by the photoelectric conversion element. Thus, it is possible for the imaging chip to have higher sensitivity than the CCD-type imaging chip. A so-called MOS sensor used in the present invention has been regarded as inferior to the CCD-type imaging chip in performance due to factors such as variations in transistors of each pixel. However, the technique that can overcome those factors has been developed in recent years. Moreover, all circuits of the imaging chip of the present invention are formed as an nMOS or pMOS, so that the number of steps in the fabrication process is reduced, and factors that can degrade the electrical characteristics of an analog portion are reduced. Thus, it is possible for the digital still camera of this embodiment to have higher image quality than a conventional digital still camera using the CCD-type imaging chip. The application of the imaging device of the present invention to a security camera also can provide a tremendous effect because the imaging device easily improves the sensitivity. The imaging device can be made extremely small while maintaining high sensitivity. Therefore, it also contributes to a reduction in size of the security camera, so that the security camera can be hidden in a place where people are not aware of being monitored.

As described above, the present invention is useful for a solid state imaging device that can reduce the chip area as a whole and the cost and equipment using the solid state imaging device.

The invention may be embodied in other forms without departing from the spirit or essential characteristics thereof The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A solid state imaging device comprising:
    an imaging semiconductor chip for outputting an analog image signal in which all transistors are formed of the same conductivity type; and
    an image processing semiconductor chip, to which the analog image signal is input, comprising CMOS transistors,
    wherein the imaging semiconductor chip comprises:
        a photoelectric converter for converting light into an electric signal; and
        an amplifier for amplifying the electric signal generated by the photoelectric converter, and
    wherein the image processing semiconductor chip comprises:
        an AD converter for converting the analog image signal output from the imaging semiconductor ship into a digital signal; and
        an image processing circuit for performing image processing based on the digital signal converted by the AD converter.

2. The solid state imaging device according to claim 1, wherein the imaging semiconductor chip is stacked on the image processing semiconductor chip.

3. The solid state imaging device according to claim 1, wherein all transistors of the imaging semiconductor chip are formed as n-channel MOS transistors.

4. The solid state imaging device according to claim 1, wherein all transistors of the imaging semiconductor chip are formed as p-channel MOS transistors.

5. The solid state imaging device according to claim 1, wherein the imaging semiconductor chip and the image processing semiconductor chip are connected electrically by a bonding wire.

6. The solid state imaging device according to claim 1, wherein a through electrode is provided in the imaging semiconductor chip, and the imaging semiconductor chip and the image processing semiconductor chip are connected electrically via wiring connected to the through electrode.

7. The solid state imaging device according to claim 6, wherein the through electrode is a Si through electrode.

8. The solid state imaging device according to claim 1, wherein the image processing semiconductor chip comprises:
   a timing generator for supplying a timing pulse to the imaging semiconductor chip;
   a gain control amplifier; and
   an analog/digital converter.

9. The solid state imaging device according to claim 2, wherein the image processing semiconductor chip comprises a plurality of terminals including a timing pulse output terminal for outputting a timing pulse,
   the imaging semiconductor chip comprises a plurality of terminals including a timing pulse input terminal for receiving the timing pulse, and
   the imaging semiconductor chip is stacked on the image processing semiconductor chip so that the timing pulse input terminal and the timing pulse output terminal are located close to each other.

10. The solid state imaging device according to claim 2, wherein the imaging semiconductor chip comprises a plurality of terminals including the image signal output terminal for outputting an image signal,
   the image processing semiconductor chip comprises a plurality of terminals including an image signal input terminal for receiving the image signal, and
   the imaging semiconductor chip is stacked on the image processing semiconductor chip so that the image signal output terminal and the image signal input terminal are located close to each other.

11. Equipment comprising:
   the solid state imaging device according to claim 1; and
   an image processing portion for processing a static image or a dynamic image produced by the solid state imaging device.

12. The equipment according to claim 11, further comprising:
   a voice coder for encoding and compressing speech data; and
   a communication controller for modulating the compressed speech data for communications,
   wherein the equipment is a cellular phone.

13. The equipment according to claim 11, further comprising:
   a voice coder for encoding and compressing speech data; and
   a communication controller for modulating the compressed speech data for communications,
   wherein the equipment is an information terminal.

14. The equipment according to claim 11, further comprising:
   an image coder/decoder for compressing and expanding images;
   a recording medium controller for recording compressed image data on a recording medium; and
   a display controller for displaying the images,
   wherein the equipment is a digital still camera.

* * * * *